(12) United States Patent
Lee et al.

(10) Patent No.: US 7,407,601 B2
(45) Date of Patent: Aug. 5, 2008

(54) POLYMERIC PARTICLE SLURRY SYSTEM AND METHOD TO REDUCE FEATURE SIDEWALL EROSION

(75) Inventors: Shen-Nan Lee, Judung Jen (TW); Ying-Ho Chen, Taipei (TW); Syun-Ming Jang, Hsin-chu (TW); Tzu-Jen Chou, Hsinchu (TW)

(73) Assignee: Taiwan Semiconductor Manufacturing Co., Ltd, Hsin-Chu (TW)

( * ) Notice: Subject to any disclaimer, the term of this patent is extended or adjusted under 35 U.S.C. 154(b) by 168 days.

(21) Appl. No.: 10/423,569

(22) Filed: Apr. 24, 2003

(65) Prior Publication Data

US 2004/0226918 A1 Nov. 18, 2004

(51) Int. Cl.
*C09K 5/00* (2006.01)
(52) U.S. Cl. ............... 252/79.1; 252/79.2; 252/79.3; 252/79.4; 252/79.5
(58) Field of Classification Search ............... 252/79.1, 252/79.2, 79.3, 79.4, 79.5; 438/693, 687, 438/652; 216/89, 105
See application file for complete search history.

(56) References Cited

U.S. PATENT DOCUMENTS

| 3,070,510 | A | * | 12/1962 | Cooley et al. ............ 424/52 |
| 5,876,490 | A | * | 3/1999 | Ronay ............ 106/3 |
| 6,277,236 | B1 | * | 8/2001 | Carlson ............ 156/345.12 |
| 6,372,648 | B1 | * | 4/2002 | Hall et al. ............ 438/692 |
| 6,638,328 | B1 | * | 10/2003 | Lee et al. ............ 51/309 |
| 6,692,546 | B2 | * | 2/2004 | Ma et al. ............ 51/298 |
| 6,936,543 | B2 | * | 8/2005 | Schroeder et al. ............ 438/692 |
| 2002/0003225 | A1 | * | 1/2002 | Hampden-Smith et al. . 252/79.1 |
| 2003/0139127 | A1 | * | 7/2003 | Choi et al. ............ 451/526 |
| 2003/0176072 | A1 | * | 9/2003 | Wang et al. ............ 438/709 |

FOREIGN PATENT DOCUMENTS

| JP | 2002-134443 | * | 5/2002 |
| SU | 415285 | * | 6/1974 |

OTHER PUBLICATIONS

Principles of Polymerization; 2nd ed.; George Odian; John Wiley & Sons; 1981[1]; NY,NY; pp. 35, 399.*

* cited by examiner

*Primary Examiner*—George A. Goudreau
(74) *Attorney, Agent, or Firm*—Tung and Associates

(57) ABSTRACT

A slurry system for a chemical mechanical polishing (CMP) process and a method for using the same wherein the slurry system includes an aqueous dispersion comprising at least abrasive polymer containing particles in an alkaline solution having a pH of less than about 9.5; and wherein the method includes providing a semiconductor wafer process surface including a oxide containing material and metal filled semiconductor features; providing the system; and, polishing in a CMP process the semiconductor wafer process surface using the slurry system to remove at least a portion of the oxide containing material and the metal comprising the metal filled semiconductor features.

33 Claims, 2 Drawing Sheets

POLYMERIC PARTICLE SLURRY SYSTEM AND METHOD TO REDUCE FEATURE SIDEWALL EROSION

FIELD OF THE INVENTION

This invention generally relates to polishing slurries used in a CMP process and more particularly to polishing slurry compositions and methods for polishing an oxide layer having metal filled semiconductor features included in semiconductor wafer process surface to reduce feature sidewall erosion.

BACKGROUND OF THE INVENTION

Planarization is increasingly important in semiconductor manufacturing techniques. As device sizes decrease, the importance of achieving high resolution features through photolithographic processes correspondingly increases thereby placing more severe constraints on the degree of planarity required of a semiconductor wafer processing surface. Excessive degrees of surface non-planarity will undesirably affect the quality of several semiconductor manufacturing process including, for example, photolithographic patterning processes, where the positioning the image plane of the process surface within an increasingly limited depth of focus window is required to achieve high resolution semiconductor feature patterns.

In the formation of conductive interconnections, copper is increasingly used for forming metal interconnects such as vias and trench lines since copper has low resistivity and good electromigration resistance compared to other traditional interconnect metals such as aluminum. The undesirable contribution to electrical parasitic effects by metal interconnect residual resistivity has become increasingly important as device sizes have decreased. One problem with the use of copper relates to its relatively high degree of softness making it subject to high differential material removal rates compared to adjacent dielectric insulating oxide materials during planarization processes such as chemical mechanical polishing (CMP).

CMP planarization is typically used several different times in the manufacture of a multi-layer semiconductor device. For example, CMP is used as one of the processes in preparing a layered device structure in a multi-layer device for subsequent processing. CMP is used to remove excess metal after filling anisotropically etched semiconductor features with metal to electrically interconnect the several layers and areas that make up a multi-layer semiconductor device.

CMP generally includes placing a process surface of the wafer in contact against a flat polishing surface, and moving the wafer and the polishing surface relative to one another. The polishing action is typically aided by a slurry which includes for example, small abrasive particles such as colloidal silica ($SiO_2$) or alumina ($Al_2O_3$) that abrasively act to remove a portion of the process surface. Additionally, the slurry may include chemicals that react with the process surface to assist in removing a portion of the surface material, the slurry typically being separately introduced between the wafer surface and the polishing pad. During the polishing or planarization process, the wafer is typically pressed against a rotating polishing pad. In addition, the wafer may also rotate and oscillate back and forth over the surface of the polishing pad to improve polishing effectiveness.

There are also several different types of slurries used in the CMP process. The most common abrasives used are silica ($SiO_2$), alumina ($Al_2O_3$), ceria ($CeO_2$), titania ($TiO_2$), and zirconia ($ZrO_2$). The abrasives are typically formed using two different methods that result in fumed and colloidal abrasives. Fumed abrasives include agglomerated particles that are larger in size than the dispersed, discrete particles of colloidal abrasives. For the same solids concentration, the removal rate using a fumed abrasive is higher than that using a colloidal abrasive due to sharp edged particle features and a broader particle size distribution in fumed abrasives. For the same reasons, the defect density using a fumed abrasive also tends to be higher.

To minimize defect formation, the colloidal abrasives having a more uniform particle size distribution are preferred. However, to achieve the same material removal rate as using a fumed abrasive, the solids concentration of a colloidal slurry must be almost three times higher. The higher required solids concentration undesirably increases the cost of the slurry and leads to difficult to clean surface residues.

One particular problem with the prior art methods of CMP involve the unique problems associated with the use of low-k (low dielectric constant) materials as an inter-layer dielectric (ILD) together with copper filled features. For example, poor adhesion between the copper and the low-k material causes peeling back of the ILD layer at the copper sidewall to occur upon subjecting the polishing surface to CMP stresses. Other defects associated with CMP of copper together with low-k materials include erosion along the ILD layer/copper feature interface (feature sidewall erosion) in both relatively wide copper areas such as bonding pads and relatively long and narrow copper filled areas such as trench lines having high pattern density.

Further, the lower strength of the low-k materials has led to increased vulnerability of copper/low-k systems to CMP induced defects caused by slurries using abrasives with relatively high hardness such as fumed alumina and silica. On the other hand, slurries with colloidal particles including alumina and silica require excessively high solids content which is believed to contribute to feature sidewall erosion and difficult to clean surface residues. For example, typical slurries in the prior art have included a relatively high solids content of about 6% to about 25% by volume. The relatively high solids content tends to increase polished material residue and slurry residue accumulation within eroded or dished portions of the surface requiring extensive cleaning processes to fully remove the accumulated residues. In addition, other chemical characteristics of prior art slurries such as pH and polishing methods adapted for polishing one layer of material in a copper CMP process may not be conducive to achieving optimal surface planarity during the polishing of other material layers underlying the copper layer. As such, it has been difficult to develop CMP methods including abrasive slurries that can accomplish both requirements of an acceptable material removal rate while minimizing the introduction of defects at the semiconductor wafer surface including feature sidewall erosion.

For example, referring to FIG. 1A, a cross sectional side view of a portion of a semiconductor wafer is shown having a copper filled feature e.g., 12, for example a bonding pad or trench line, is formed in ILD layer 14A by an anisotropic etching process. The feature is typically filled with copper layer 16B by an electroplating process after forming an adhesion/barrier layer e.g., 16A, for example tantalum nitride (TaN) to line the feature opening. The feature openings are anisotropically etched into a low-k dielectric material ILD layer 14A formed of, for example, carbon or fluorine doped oxide, and one or more layers of an oxide 14B, for example having an ARC coating, for example formed of silicon oxynitride (e.g., SiON) and an optional oxide capping layer, for example SiO$_2$, formed overlying the ILD layer 14A.

Referring to FIG. 1B, in a typical CMP process, the excess copper in copper layer 16B above the feature level is first removed followed by removal of an overlying adhesion/barrier layer 16A above the feature level. Finally an oxide CMP polishing process, using a slurry containing a polishing formulation according to the prior art is then used to remove the oxide layer 14B and buff or remove residual scratches in the ILD layer 14A. During the polishing process, feature sidewall erosion, for example as shown at 18A at the ILD layer/copper interface forms a sidewall recess with acts to trap slurry and polished material residue. In addition, peeling of the ILD layer away from the copper filled feature during CMP frequently occurs. Further, the presence of recessed areas in the copper feature surface caused by dishing or erosion during the CMP process compromises device electrical reliability.

For example referring to FIG. 1C is shown a feature profile at line A1 as obtained by a profilometer measurement of a copper filled bonding pad following a CMP process including an oxide polishing process according to the prior art. Shown on the vertical axis is relative depth in Angstroms from the wafer surface adjacent the copper bonding pad. Shown on the horizontal axis is the distance in microns along the wafer surface including the copper bonding that the profilometer is passed over (scan length). The sidewall recesses are indicated at A2 and A3 having a depth of about 1400 Angstroms.

Therefore, there is a need in the semiconductor art to develop a slurry composition and method for polishing a metal filled semiconductor feature to reduce CMP induced defects including sidewall feature erosion.

It is therefore an object of the invention to provide a slurry composition and method for polishing a metal filled semiconductor feature to reduce CMP induced defects including sidewall feature erosion while overcoming other shortcomings and deficiencies in the prior art.

SUMMARY OF THE INVENTION

To achieve the foregoing and other objects, and in accordance with the purposes of the present invention, as embodied and broadly described herein, the present invention provides a slurry system for a chemical mechanical polishing (CMP) process and a method for using the same wherein the slurry system includes an aqueous dispersion comprising at least abrasive polymer containing particles in an alkaline solution having a pH of less than about 10; and wherein the method includes providing a semiconductor wafer process surface including a oxide containing material and metal filled semiconductor features; providing the system; and, polishing in a CMP process the semiconductor wafer process surface using the slurry system to remove at least a portion of the oxide containing material and the metal comprising the metal filled semiconductor features.

These and other embodiments, aspects and features of the invention will be better understood from a detailed description of the preferred embodiments of the invention which are further described below in conjunction with the accompanying Figures.

DETAILED DESCRIPTION OF THE PREFERRED EMBODIMENTS

Figure 1A:
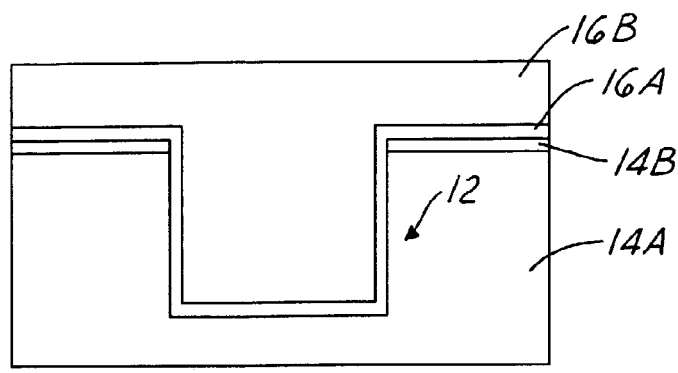
FIGS. 1A and 1B are conceptual cross sectional side view representations of an exemplary semiconductor feature including following a copper CMP process according to the prior art.
Figure 1B:
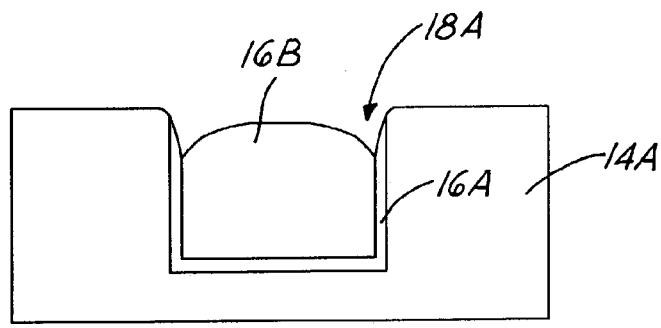

Although the slurry system according to present invention is explained with reference to copper semiconductor features formed in a low-k dielectric material layer associated with a multilayer semiconductor device, it will be appreciated that the slurry system may be advantageously used in a CMP process to polish copper semiconductor features formed in having an adjacent oxide containing material layer. In addition, although the method of the present invention is explained with reference to an exemplary relatively wide area copper filled semiconductor feature, for example a bonding pad, it will be appreciated that the slurry system may advantageously be used for polishing any copper filled semiconductor feature where it would be advantageous to reduce erosion and/or dishing of the feature in a CMP process including polishing an oxide layer adjacent a copper filled (damascene) semiconductor feature including vias, trench lines and dual damascene features. In addition, while the slurry system of the present invention is advantageously used to polish a copper filled (damascene) semiconductor feature it will be appreciated that it may advantageously be used with other metal filled (damascene) features to achieve the goals of reducing sidewall recess formation, increasing surface planarity, and reducing ILD layer peeling in a CMP process. As used herein, the term "copper" is meant copper and alloys thereof. The term "low-k" means having a dielectric constant of less than about 3.2.

In a first embodiment of the invention a slurry system is provided for polishing a metal filled semiconductor feature in a CMP process including polymeric abrasive particles in an alkaline solution. In an important feature of the invention, the slurry system preferably has a pH of less than about 10.0, preferably between about 7.0 and about 10.0 in an oxide/copper CMP polishing step. For example, in the prior art, alkaline slurries having a pH of greater than about 10.0 are typically used in oxide/copper polishing processes to prevent particle agglomeration and sedimentation of inorganic slurry particles. Among the advantages of the slurry system of the present invention, the polymer containing particles, preferably having a polymeric surface for contacting a polishing surface, allow a less alkaline slurry system to be used, for example in a copper/oxide material polishing process thereby advantageously reducing oxide dissolution while avoiding particle agglomeration to improve polishing planarity. For example, the polymeric particles have an iso-electric point that prevents agglomeration of the particles at relatively lower pH compared to metal oxide particles.

Preferably the abrasive polymer containing particles are colloidal particles have a mean diameter of about 20 nm to about 500 nm, more preferably about 50 nm to about 200 nm. The term "particle" as it is used herein refers to both agglomerates of more than one primary particle and to single (unagglomerated) or primary particles, however the "mean particle diameter" as used herein refers to the mean diameter of the primary particle whether agglomerated with other primary particles or not. The term "mean particle diameter" additionally refers to a mean diameter taken from a statistically significant sampling of the average equivalent spherical diameter of primary particles when using a particle size determination means including TEM image analysis. Preferably the polymeric abrasive particles included in the slurry system have a particle size distribution with greater than about 90 percent of the particles having a particle size of less than about 200 nm.

In another important feature of the invention, the slurry system preferably has an abrasive polymer containing particle solids content of about 0.5 weight % to about 10 weight %, more preferably about 4.0 weight % to about 6 weight %, with respect to a slurry volume weight. For example, it has been found that using a slurry having a reduced abrasives solids content compared to prior art processes, that sidewall erosion to form recesses or divots at the copper/ILD layer interface is reduced (e.g., a trench in the dielectric layer surrounding the copper inter connect line). It is believed that together with the relatively softer, including elastomeric characteristics, of the polymer containing abrasive particles and the relatively lower solids content of the slurry system, that sidewall erosion in copper filled features is reduced by minimizing the incidence of and force of impact and abrasion at the sidewall portions of the feature.

In another preferred embodiment, the slurry system of the present invention includes a basic solution containing at least one of ammonium hydroxide ($NH_4OH$), ammonia ($NH_3$), and tetra methyl ammonium hydroxide (TMAH).

In another preferred embodiment, the slurry system of the present invention optionally includes a surfactant or wetting agent from about 0.01 weight % to about 0.5 weight %. Although a wide variety of surfactants known in the art may be suitably used, preferably the surfactant includes a surfactant selected from the group of fatty acids and salts thereof, for example, a soap or detergent, where the fatty acid or salt thereof has one or more polar groups such as $COOH$, $SO_3H$, $PO_3H$ and mixtures thereof. For example, the addition of a surfactant, for example a fatty acid derived soap or detergent, improves the planarity in a CMP polishing process and reduces sidewall erosion, due to what is believed to be due to reduced friction between the polymeric particles and the polishing surface. Other suitable surfactants include glycols, aliphatic polyethers, and akoxylated alkyphenols.

Preferably the polymer containing abrasive particles are formed of an elastomeric polymer material, for example polyurethanes, neoprenes, silicones, fluorosilicones, fluorocarbon polymers, polysulfones, acrylic resins, polyacetals, saturated polyesters, polyamides, polyimides, polypropylenes, phenol resins, urea resins, melamine resins, epoxy resins, and the like. In one embodiment, polyurethane elastomers are preferred since they have high compressibility, high tensile strength and high modulus. Generally, a harder elastomer results in a correspondingly lower the compressibility. This combination provides optimal toughness and durability and is one of the distinctive characteristics of polyurethane elastomers. Further, the properties of elastomeric polymers are easily altered by chemical additives and processing conditions that are well known in the art to alter the hardness, for example, over a range of about 70D to about 100D according to an elastomer durometer hardness test. Elastomeric polymer containing particles including mono-dispersed particles may be made by conventional methods at the preferred mean diameters and particle size distributions sizes by methods known in the art. Other polymeric materials may suitably be used to form the polymer containing particles including low hardness thermoplastic materials, such as polyether- and polyester-based polyurethanes, polyvinyl chlorides, fluoroelastomers and the like.

Alternatively, the polymeric material may be coated onto base colloidal inorganic particles such as silicon dioxide ($SiO_2$), titanium dioxide ($TiO_2$) and cerium oxide ($CeO_2$), or mixtures thereof by conventional methods including sol-gel precipitation methods to form the polymeric containing particles. In an important feature of the invention the polymeric abrasive particle exhibits elastic behavior to allow partial absorbtion of impact forces, for example, when an abrasive particle impacts a feature sidewall at the feature/ILD layer interface.

In operation, the polymeric abrasive particle slurry system of the present invention provides a system whereby the polymeric particles are at least partially elastic and compressible such that a lower localized compressive force is applied to the polishing target surface, a portion of the applied compressive force being absorbed by the compressible base particles. As a result, the application of the proper compressive force to the target polishing surface, for example about 5 PSI to about 10 PSI is locally modified by the force absorbing characteristics of the polymeric particles so as to smooth variations in the applied compressive force to the polishing target surface thereby avoiding application of excessive forces that result in erosion of copper filled semiconductor features including peeling of the adjacent ILD layer. The polymeric containing particles are also believed to act to equalize distributed forces across the polishing target surface, for example a semiconductor wafer, thereby reducing dishing and erosion effects.

For example, the present invention may be advantageously used for CMP of low-k materials alone or in conjunction with metal filled features. Exemplary low-k inorganic materials include, for example, carbon doped oxide (C-oxide), fluorine doped oxide (e.g., fluorinated silicate glass), porous oxides, xerogels, or SOG (spin-on glass). The metal filled features may suitably include for example, tungsten (W), aluminum (Al), and copper (Cu), and alloys thereof.

While the slurry system of the present invention may be used on a wide variety of systems, it is advantageously used with low-k materials including copper conducting areas such as bonding pads and metal interconnect lines to prevent peeling, among other advantages, of the uppermost low-k dielectric layers associated with a multilayer device.

Figure 2A:
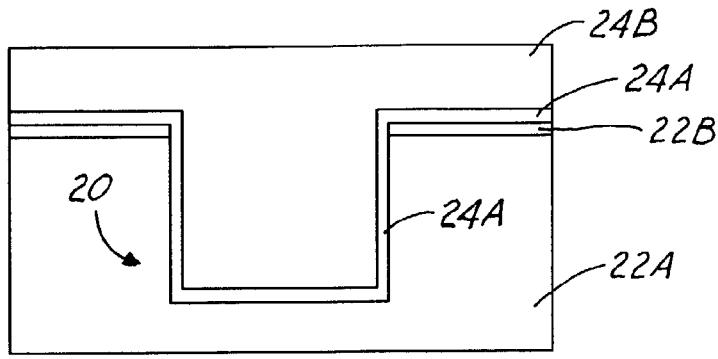
FIGS. 2A through 2C are conceptual cross sectional side views of an exemplary semiconductor feature formed including a CMP process using the CMP oxide polishing process according to an embodiment of the present invention.

For example, referring to FIG. 2A is shown a semiconductor feature, for example a copper filled bonding pad 20 formed in a dielectric insulating layer 22A, for example formed of a low-k (low dielectric constant) material also referred to as an inter-layer dielectric (ILD) layer. The copper filled bonding pad overlies and is in electrical communication with and underlying conductive areas (not shown). An oxide layer 22B is formed over the ILD layer 22A including at least one of a capping layer, for example $SiO_2$ and an ARC layer, for example silicon oxynitride (e.g., SiON). The low-k ILD layer 22A is preferably $SiO_2$ based, for example, carbon or fluorine doped silicon oxides as are known in the art, but may additionally include organic ILD layers including an oxide capping layer such as an $SiO_2$ or silicon oxynitride (e.g., SiON) capping layer. Exemplary organic low-k materials include polyarylene ether, hydrogen silesquioxane (HSQ), methyl silsesquioxane (MSQ), polysilsequioxane, polyimide, benzocyclobutene, and amorphous Teflon.

Still referring to FIG. 2A, a bonding pad opening is first formed by photo-lithographically patterning and anisotropically etching the ILD layer 22A followed by the blanket deposition of an adhesion/barrier layer 24A at a thickness from about 50 Angstroms to about 150 Angstroms to line the bonding pad opening. An electro-chemical deposition (ECD) process is then used to deposit copper layer 24B over a seed layer of copper (not shown) deposited according to CVD or PVD methods over the adhesion/barrier layer 24A. The ECD copper layer is deposited by conventional ECD methods to fill the bonding pad opening including a portion of the copper layer 24B above the feature level.

Figure 2B:
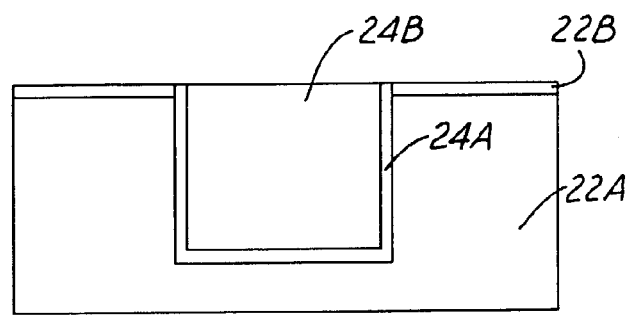
Figure 2C:
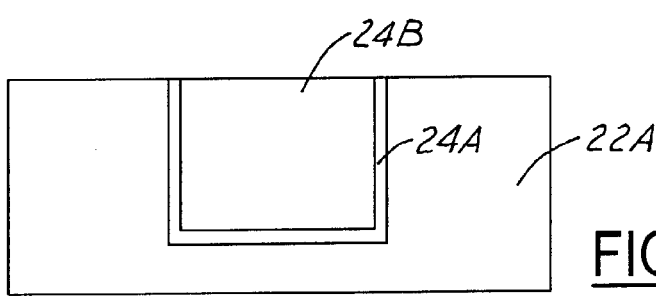

Referring to FIG. 2B, in a copper CMP process, typically a first CMP process step is carried out to remove the excess copper overlying the feature level in copper layer 24B followed by a second CMP process step to remove the adhesion/barrier layer 24A above the feature level to at least partially expose the underlying oxide layer 22B. The first and second CMP processes are carried out with conventional slurry systems and polishing pads as are known in the art, preferably using slurry systems optimized for removing the copper layer 24B in the first CMP process and at least partially removing the adhesion/barrier layer 24A in the second CMP process.

Referring to FIG. 3B, a third CMP step is then carried out using the slurry system according to preferred embodiments of the present invention in an oxide polishing process to remove a remaining portion of the adhesion/barrier layer 24A and the oxide layer 22B and to polish the ILD layer 22A to buff or remove scratches in the ILD layer remaining from previous CMP processes. It will be appreciated that the same polishing pad may be used from a previous adhesion/barrier CMP process, however, preferably, a different polishing pad is used to minimize cross contamination. In addition, it will be appreciated that a wide assortment of polishing pads and polishing pad material with varying hardness are available that may be suitably used with the slurry system of the present invention. In one embodiment, the polishing pad used in the third CMP process is formed of the same material as the polymeric abrasive particles, for example an elastomeric polyurethane polishing pad having a hardness equal to or greater compared to the polymer containing abrasive particles to minimize pad deformity. It will be appreciated that the polishing pads may further be stacked to minimize pad deformation during polishing. For example polyurethane polymeric particles having a measured durometer hardness of about 75D are used with a polyurethane polishing pad having a durometer hardness of about 95D. The use of a polishing pad with a polishing pad having a higher hardness compared to the polymeric abrasive polymers, for example having a hardness about 10 percent to about 25 percent harder than the polymeric abrasive particles is believed to enhance the various advantages of the slurry system according to the present invention including reducing feature sidewall recess formation, improving global and local planarity to reduce surface topography, and to reduce the incidence of ILD layer peeling form the metal filled feature sidewall.

Figure 1C:
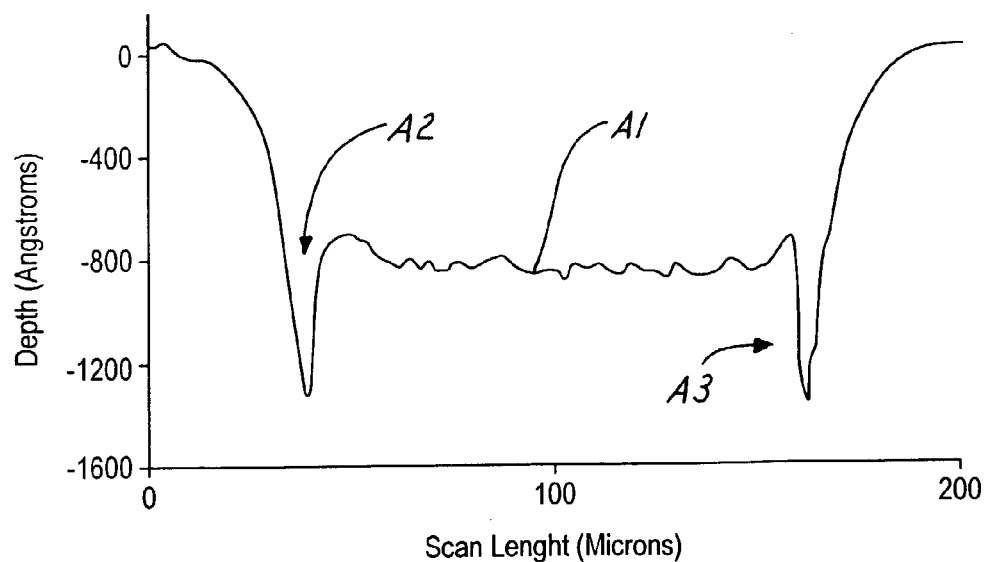
FIG. 1C is a profilometer diagram representing a profilometer scan over a copper bonding pad indicating sidewall recesses according to a CMP process including an oxide polishing process according to the prior art.
Figure 3:
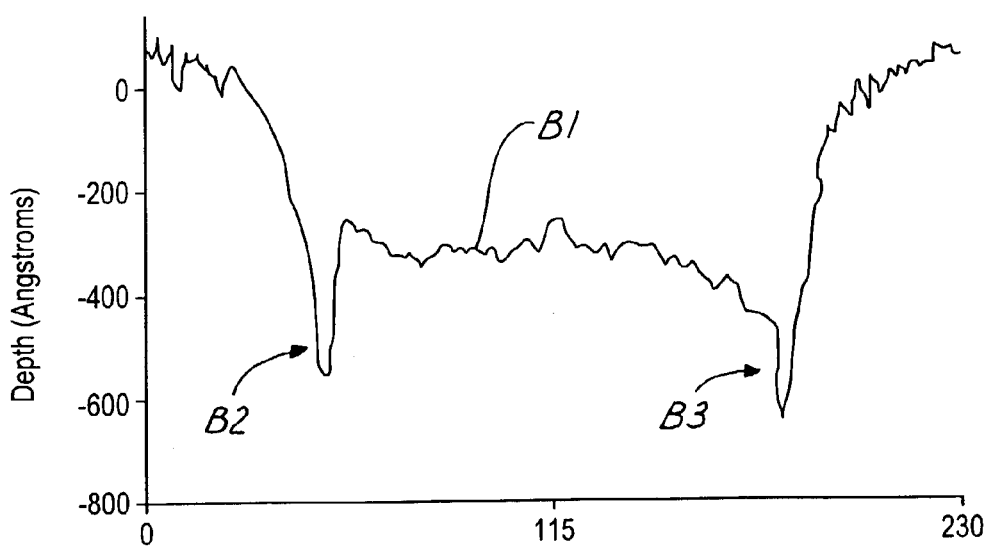
FIG. 3 is a profilometer diagram representing a profilometer scan over a copper bonding pad indicating sidewall recesses according to a CMP oxide polishing process according to the present invention.

For example, referring to FIG. 3 is shown a feature profile shown as line B1 as obtained by a profilometer measurement of a copper filled bonding pad following a CMP process including an oxide polishing process using the slurry system according to an embodiment of the present invention. The data can be compared with the prior art results shown in FIG. 1C where the third CMP process or oxide polishing process was carried out using a prior art slurry system. Shown on the vertical axis is relative depth in Angstroms from the wafer surface adjacent the copper bonding pad. Shown on the horizontal axis is the distance in microns along the wafer surface including the copper bonding that the profilometer is passed over (scan length). The sidewall recesses are indicated at B2 and B3 having depths about 600 to about 700 Angstroms with an average overall recess depth of about 300 Angstroms. It is seen that compared to prior art processes both the overall average recess depth of the bonding pad including sidewall erosion is reduced.

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. A slurry system for an improved low-K oxide/copper chemical mechanical polishing (CMP) process with low solids content to avoid copper damascene sidewall erosion and to reduce CMP impact forces comprising:

an aqueous dispersion comprising particles, said particles comprising a first material having an elastomeric polymer outer surface, said first material surrounding a core comprising a second material, said second material different from said first material, said particles in said aqueous dispersion capable of exhibiting elastic behavior during the CMP process, said elastomeric polymer only on said particles in said aqueous dispersion;

said aqueous dispersion having a pH of between about 7.0 and about 10.0, and, wherein said aqueous dispersion has a solids content of said particles of between about 0.5 and about 6.5 weight percent of the total weight of the aqueous dispersion.

2. The slurry system of claim 1, wherein the particles comprise a thermoplastic material.

3. The slurry system of claim 1, wherein the elastomeric polymer outer surface comprises a material selected from the group consisting of polyurethanes, neoprenes, silicones, fluorosilicones, fluorocarbon polymers, polysulfones, acrylic resins, polyacetals, saturated polyesters, polyamides, polyimides, polypropyilenes, phenol resins, urea resins, melamine resins, and epoxy resins.

4. The slurry system of claim 1, wherein the particles comprise an elastomeric polymer coating over a metal oxide.

5. The slurry system of claim 1, wherein the particles have a mean particle diameter of from about 20 nanometers to about 500 nanometers.

6. The slurry system of claim 1, wherein the particles have a mean particle diameter of from about 50 nanometers to about 200 nanometers.

7. The slurry system of claim 1, wherein the slurry system further comprises an additive selected from the group consisting of ammonium hydroxide ($NH_4OH$), ammonia ($NH_3$), and tetra methyl ammonium hydroxide (TMAH).

8. The slurry system of claim 1, further comprising a surfactant at about 0.01 weight percent to about 0.5 weight percent.

9. The slurry system of claim 8, wherein the surfactant is selected from the group consisting of fatty acids and their salts.

10. The slurry system of claim 9, wherein the surfactant includes at least one of a detergent and a soap.

11. The slurry system of claim 1, wherein the elastomeric polymer outer surface surrounds a core comprising an inorganic material.

12. A slurry system for an improved low-K oxide/copper chemical mechanical polishing (CMP) process to reduce copper damascene sidewall erosion comprising:

an alkaline aqueous dispersion comprising abrasive particles, said abrasive particles consisting essentially of particles comprising a first material having an elastomeric polymer outer surface, said first material surrounding a core comprising a second material, said second material different from said first material, said abrasive particles in said alkaline aqueous dispersion capable of exhibiting elastic behavior during the CMP process, said elastomeric polymer only on said particles in said alkaline aqueous dispersion.

13. The slurry system of claims 12 wherein said alkaline aqueous dispersion has a pH of between about 7.0 and about 10.0.

14. The slurry system of claims 12 wherein said alkaline aqueous dispersion has a solids content of said particles of between about 0.5 and about 6.5 weight percent of the total weight of the aqueous dispersion.

15. The slurry system of claim 12, wherein the particles comprise a thermoplastic material.

16. The slurry system of claim 12, wherein the elastomeric polymer outer surface comprises a material selected from the group consisting of polyurethanes, neoprenes, silicones, fluorosilicones, fluorocarbon polymers, polysulfones, acrylic resins, polyacetals, saturated polyesters, polyamides, polyimides, polypropylenes, phenol resins, urea resins, melamine resins, and epoxy resins.

17. The slurry system of claim 12, wherein the particles comprise an elastomeric polymer coating over a metal oxide.

18. The slurry system of claim 12, wherein the abrasive particles have a mean particle diameter of from about 20 nanometers to about 500 nanometers.

19. The slurry system of claim 12, wherein the abrasive particles have a mean particle diameter of from about 50 nanometers to about 200 nanometers.

20. The slurry system of claim 12, wherein the slurry system further comprises an additive selected from the group consisting of ammonium hydroxide ($NH_4OH$), ammonia ($NH_3$), and tetra methyl ammonium hydroxide (TMAH).

21. The slurry system of claim 12, further comprising a surfactant at about 0.01 weight percent to about 0.5 weight percent.

22. The slurry system of claim 21, wherein the surfactant is selected from the group consisting of fatty acids and their salts.

23. The slurry system of claim 12, wherein the elastomeric polymer outer surface surrounds a core comprising an inorganic material.

24. A slurry system for an improved low-K oxide/copper chemical mechanical polishing (CMP) process to reduce copper damascene sidewall erosion comprising:
an alkaline aqueous dispersion comprising abrasive particles, said abrasive particles consisting essentially of particles comprising a first material having an elastomeric polymer outer surface, said first material surrounding a core comprising a second material, said second material different from said first material, said abrasive particles in said alkaline aqueous dispersion capable of exhibiting elastic behavior during the CMP process, said elastomeric polymer only on said particles in said alkaline aqueous dispersion;
wherein said alkaline aqueous dispersion has a pH of between about 7.0 and about 10.0, and,
wherein said alkaline aqueous dispersion has a solids content of said particles of between about 0.5 and about 6.5 weight percent of the total weight of the aqueous dispersion.

25. The slurry system of claim 24, wherein the particles comprise a thermoplastic material.

26. The slurry system of claim 24, wherein the elastomeric polymer outer surface comprises a material selected from the group consisting of polyurethanes, neoprenes, silicones, fluorosilicones, fluorocarbon polymers, polysulfones, acrylic resins, polyacetals, saturated polyesters, polyamides, polyimides, polypropylenes, phenol resins, urea resins, melamine resins, and epoxy resins.

27. The slurry system of claim 24, wherein the abrasive particles comprise an elastomeric polymer coating over a metal oxide.

28. The slurry system of claim 24, wherein the abrasive particles have a mean particle diameter of from about 20 nanometers to about 500 nanometers.

29. The slurry system of claim 24, wherein the slurry system further comprises an additive selected from the group consisting of ammonium hydroxide ($NH_4OH$), ammonia ($NH_3$), and tetra methyl ammonium hydroxide (TMAH).

30. The slurry system of claim 24, further comprising a surfactant selected from the group consisting of fatty acids and their salts.

31. The slurry system of claim 24, further comprising a surfactant at about 0.01 weight percent to about 0.5 weight percent.

32. The slurry system of claim 31, wherein the surfactant is selected from the group consisting of fatty acids and their salts.

33. The slurry system of claim 24, wherein the elastomeric polymer outer surface surrounds a core comprising an inorganic material.

* * * * *